United States Patent [19]
Abernathy et al.

[11] Patent Number: 5,459,097
[45] Date of Patent: Oct. 17, 1995

[54] METHOD FOR SELECTIVELY GROWING ALUMINUM-CONTAINING LAYERS

[75] Inventors: Cammy R. Abernathy, Scotch Plains; Stephen J. Pearton, Summit; Fan Ren, Warren; Patrick W. Wisk, Greenbrook, all of N.J.

[73] Assignee: AT&T Corp., Murray Hill, N.J.

[21] Appl. No.: 133,818

[22] Filed: Oct. 7, 1993

Related U.S. Application Data

[63] Continuation of Ser. No. 799,238, Nov. 27, 1991, abandoned.

[51] Int. Cl.$^6$ .................................................. H01L 21/20
[52] U.S. Cl. ............................ 437/89; 117/104; 117/90; 117/95; 117/954
[58] Field of Search ........................ 437/81, 89; 117/104, 117/90, 95, 954

[56] References Cited

FOREIGN PATENT DOCUMENTS

| 0053415 | 4/1980 | Japan | 437/89 |
|---|---|---|---|
| 0308033 | 12/1989 | Japan | 437/89 |

OTHER PUBLICATIONS

Weyers, M., *Journal of Crystal Growth*, 107, No. 1/4, pp. 1021–1029 (Jan. 1991).
Schutz, A., *Journal of Crystal Growth*, 107, No. 1/4, pp. 1036–1037 (Jan. 1991).
Abernathy, C. R., et al., *Journal of Crystal Growth*, 124, No. 1/4, pp. 63–69 (Nov. 1992).
Azoulay et al. "Selective MOCVD Epitaxy for Optoelectronic Devices," Journal of Crystal Growth 55 (1981) pp. 229–234.
Brauers, et al. "The Use of Organic As Precursors in the Low Pressure MOCVD of GaAs," Journal of Crystal Growth 93 (1988) pp. 7–14.
Goorsky, et al., "Epitaxial Growth and Selectivity of AlxGa1–xAs Using Novel Metalorganic Precursors," J. Electrochem. Soc., vol. 138, No. 6, Jun. 1991, pp. 1817–1826.
Haywood, S., Growth of InAs By MOVPE: A Comparative study using Arsine, tertiarylbutylarsine and phenylarsine, J. Cryst. Growth, vol. 97, No. 2, Sep. 1989, pp. 489–496.
G. J. Davies, et al. "Metal–organic molecular beam epitaxy (MOMBE)" *Chemtronics*, vol. 3, pp. 3–16 (1988).
W. T. Tsang, "The Growth of GaAs, AlGaAs, InP and InGaAs by Chemical Beam Epitaxy Using Group III and V Alkyls", *Journal of Electronic Materials*, pp. 235–245 (1986).
T. Kui, et al. "Metal–Organic Molecular–Beam Epitaxy with a New Arsenic Precursor As[N(CH$_3$)$_2$]$_3$: Characterization of the Decomposition Processes and Growth of GaAs", *Extended Abstracts of the 1991 International Conference on Solid State Devices and Materials*, pp. 408–410 (1991).
T. Takahashi, et al. "Carbon–Doped–Base AlGaAs/GaAs HBTs Grown by Gas–Source MBE Using Only Gaseous Sources", Extended Abstracts of the 1991 *International Conference on Solid State Devices and Materials*, pp. 359–361, (1991).

*Primary Examiner*—R. Bruce Breneman
*Assistant Examiner*—Linda J. Fleck
*Attorney, Agent, or Firm*—Glen E. Books

[57] ABSTRACT

In accordance with the invention, aluminum-containing layers are grown by molecular beam processes using as an arsenic precursor phenylarsine (PhAs). Because PhAs is more reactive than arsine and less reactive than arsenic, it decomposes selectively on III–V surfaces but not on mask materials. Thus in contrast to conventional processes, growth using PhAs permits selective growth on unmasked gallium arsenide surfaces but inhibits growth on typical mask materials such as silicon nitride.

6 Claims, 2 Drawing Sheets

1

METHOD FOR SELECTIVELY GROWING ALUMINUM-CONTAINING LAYERS

This application is a continuation of application Ser. No. 07/799,238, filed on Nov. 27, 1991, abandoned.

FIELD OF THE INVENTION

This invention relates to methods for fabricating gallium arsenide semiconductor devices and, in particular, to methods for selectively growing aluminum-containing layers such as aluminum gallium arsenide.

BACKGROUND OF THE INVENTION

Because of their high speeds and direct bandgap capabilities, gallium arsenide devices offer considerable promise for use as high speed electronic and photonic devices and integrated circuits. Such devices typically comprise a plurality of layers of gallium arsenide and aluminum gallium arsenide which are doped to n or p type conductivity and configured to operate as semiconductor electronic devices such as bipolar or field effect transistors or as photonic devices such as photodetectors or surface emitting lasers.

A preferred method of fabricating a gallium arsenide layered structure is molecular beam epitaxy such as the process of metalorganic molecular beam epitaxy (MOMBE) described by G. J. Davies et al, 3 *Chemtronics* 3 (1988). Other molecular beam processes are described by W. T. Tsang, *Journal of Electronic Materials*, p. 235 (1986).

In essence a molecular beam process involves disposing a substrate within a low pressure growth chamber, heating the substrate and directing onto the substrate a molecular beam of gaseous molecules which decompose to form a desired layer. Processes referred to as MBE typically use only elemental sources for the Group III, Group V, and dopant elements, whereas MOMBE processes use a wide variety of elemental and compound gaseous sources providing at least one of the Group III or dopant elements. Typical MOMBE processes used in the fabrication of pnp and npn transistors are described in the copending applications of C. R. Abernathy et al, Ser. Nos. 07/662,549 and 07/662,550 both filed Feb. 28, 1991.

One undesirable feature of prior art molecular beam processes is their use of arsine ($AsH_3$) or arsenic as a source in the growth of aluminum gallium arsenide. A number of device fabrication schemes require selective regrowth of aluminum gallium arsenide layers in unmasked limited areas of masked substrates. At desired low temperatures ($\leq 600°$ C.) regrowth using arsine or arsenic is non-selective, leading to growth not only on the unmasked substrate but also upon the mask.

Efforts to achieve selective AlGaAs growth have achieved only limited success. As or $As_2$ adheres to the mask surface and catalyzes the decomposition of Al precursors. Growth temperatures in excess of 600° C. are required to prevent nucleation of Al-containing materials on the mask surface. But for fabrication of many electronic devices, lower growth temperatures are desired. Accordingly, there is a need for improved methods for selectively growing aluminum-containing layers.

SUMMARY OF THE INVENTION

In accordance with the invention, aluminum-containing layers are grown by molecular beam processes using as an arsenic precursor phenylarsine (PhAs). Because PhAs is more reactive than arsine and less reactive than arsenic, it decomposes selectively on III–V surfaces but not on mask materials. Thus in contrast to conventional processes, growth using PhAs permits selective growth on unmasked gallium arsenide surfaces but inhibits growth on typical mask materials such as silicon nitride.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical illustrations, are not to scale.

DETAILED DESCRIPTION

Figure 1:
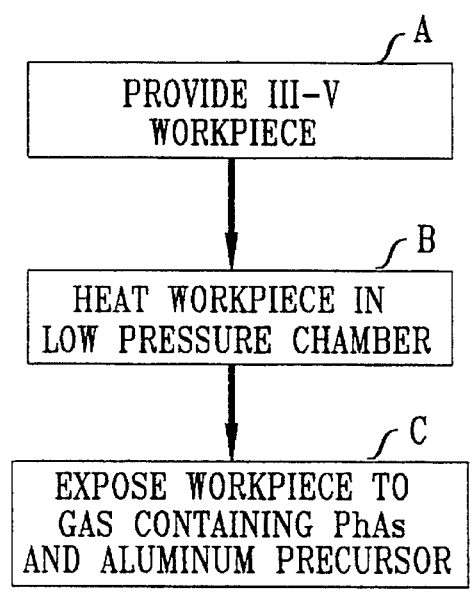
FIG. 1 is a block diagram showing the steps in growing an aluminum-containing layer in accordance with the invention.
Figure 2:
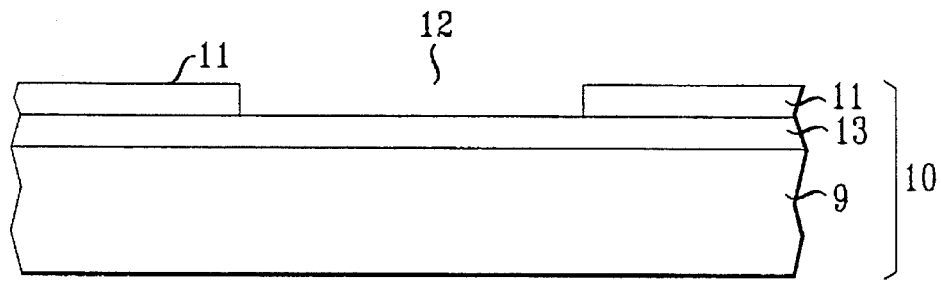
FIG. 2 is a schematic cross section of a typical workpiece upon which a layer of aluminum gallium arsenide can be grown in accordance with the invention.
Figure 3:
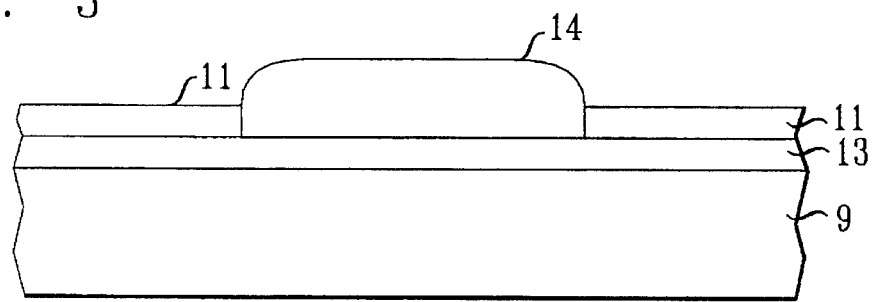
FIG. 3 shows the workpiece of FIG. 2 after growth in accordance with the invention.

Referring to the drawings, FIG. 1 illustrates the steps in depositing an aluminum-containing layer in accordance with the invention, and FIGS. 2 and 3 show schematic cross sections of a typical workpiece before and after the deposition process of FIG. 1.

As shown in FIG. 1A the first step is to provide a workpiece 10 comprising a substrate 9 having a surface layer 13 of III–V semiconductor of the gallium arsenide family.

As shown in FIG. 2 the workpiece 10 can include a masking layer 11 of non III–V material such as silicon nitride exposing only a predetermined area 12 of a semiconductor layer 13. Such a workpiece can be the result of several preceding steps producing a desired stack of different doped semiconductor layers (not shown) in the region beneath mask 11 and even in the region underlying layer 13. The semiconductor can be any material in the gallium arsenide family including gallium arsenide, aluminum gallium arsenide, indium gallium arsenide, aluminum arsenide, aluminum indium arsenide, or aluminum indium phosphide.

The next step shown in FIG. 1B is to heat the workpiece in an evacuated chamber which can be referred to as a growth chamber. The workpiece 10 is placed in a growth chamber, such as an INTEVAC Gas Source Gen II, evacuated to low pressure less than $10^{-4}$ torr and heated to a temperature less than 600° C. and preferably 500°–550° C. Advantageously the exposed semiconductor surface as formed, is substantially free of impurities such as residual oxides or the surface is thoroughly cleaned in accordance with techniques well known in the art.

As shown in FIG. 1C, the next step is exposing the semiconductor surface to gaseous molecules of phenylarsine and, at the same time, to a gaseous precursor containing aluminum, such as trimethylamine alane (TMAAl). Where, as here, the desired aluminum-containing material is AlGaAs, the surface should also be exposed to a gaseous precursor containing gallium such as trimethylgallium (TMG). Phenylarsine is available from Air Products and Chemicals, Inc., Allentown, Pa. Preferably the precursors are all introduced into the growth chamber via an $H_2$ carrier gas directed onto the substrate at a flow rate in the range 0.1–20 SCCM. The result is selective epitaxial growth of aluminum gallium arsenide on the semiconductor surface at a rate on the order of 95 angstroms/min.

The resulting structure is schematically illustrated in FIG. 3. As can be seen, the growth layer 14 is selectively formed on the semiconductor layer 13 and not on the mask layer 11. If desired, the mask layer 11 can be selectively removed, as by dissolving silicon nitride in hot phosphoric acid.

This process using PhAs has many advantages over the prior use of arsine as an arsenic precursor. PhAs provides selective growth over a wider range of growth temperatures than arsine. In particular it provides selective growth at low temperatures ($\leq 600°$ C.) desirable for the fabrication of semiconductor electronic and photonic devices.

Figure 4:
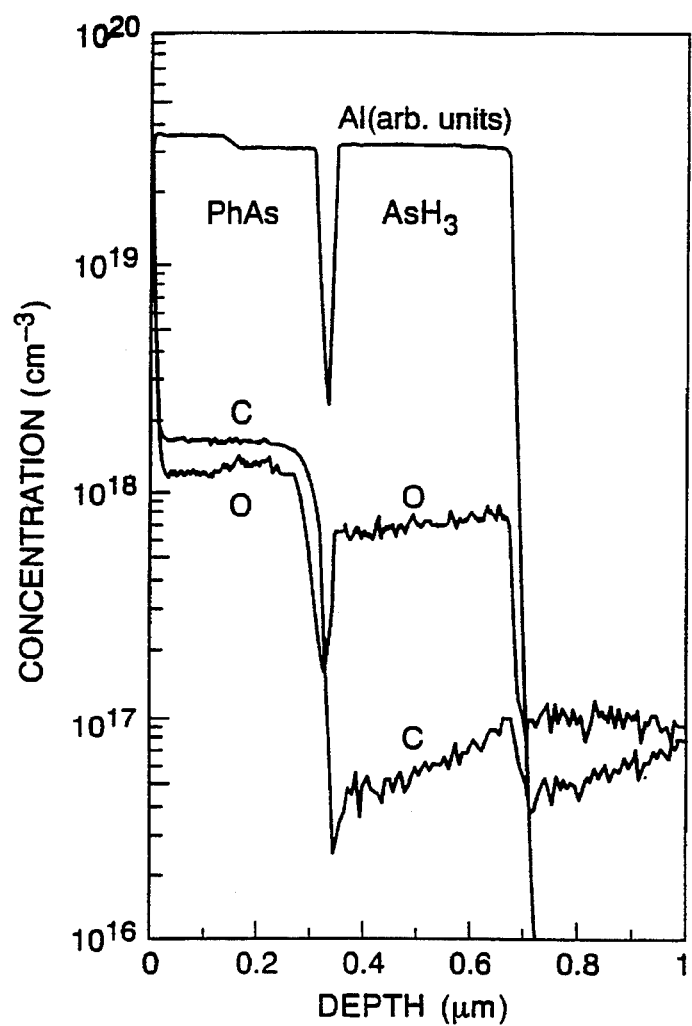
FIG. 4 is a graphical illustration of measured concentration versus depth using various precursors.

PhAs is particularly useful in selectively growing p-type layers of aluminum gallium arsenide because it does not preclude incorporation of carbon which for aluminum gallium arsenide, is a p-type dopant. The results of this effect can be seen by reference to FIG. 4 which plots the concentration of various elements versus depth for successive layers grown using various precursors. As illustrated growth with triethylgallium (TEG) trimethylamine alane (TMAAl) and arsine resulted in a carbon level of about $5 \times 10^{16}$ cm$^{-3}$. By contrast, when the same group III fluxes were combined with phenylarsine, the carbon content was increased to about $1.8 \times 10^{18}$ cm$^{-3}$.

The invention can be understood in greater detail by consideration of the following specific example of the fabrication of a bipolar transistor. The structure is shown in FIG. 5 and details of the fabrication process are set forth in Table 1.

Figure 5:
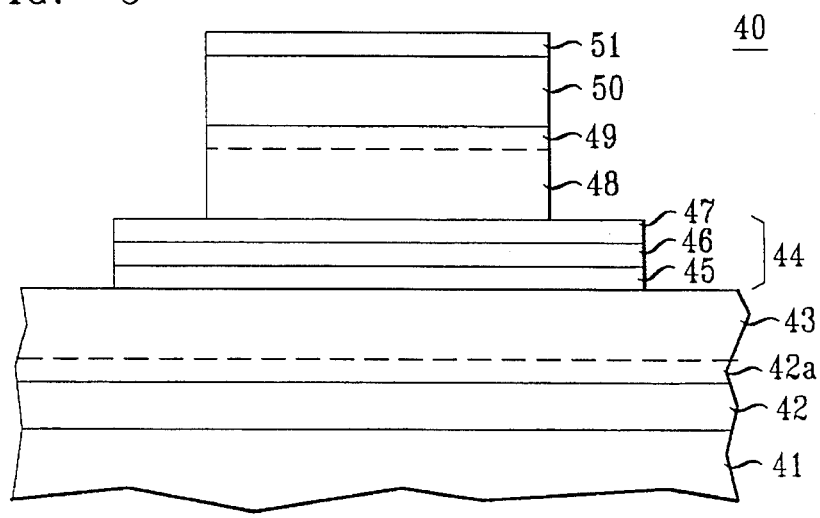
FIG. 5 is a schematic view of a preferred electronic device fabricated using the inventive method among the various fabrication steps.

FIG. 5 is a schematic view of a gallium arsenide device in the form of an "emitter-up" pnp transistor which can be advantageously fabricated using the inventive method. The device 40 depicted in FIG. 5 consists of a substrate 41 supporting successively grown layers 42, serving as transistor sub-collector, collector 43, and base region 44, in turn consisting of layers 45, 46, and 47. It is convenient to describe layer 46 as the functional base layer with embracing layers 45 and 47 (generally compositionally graded) serving as spacer regions (some in the art refer to the entirety of region 44 as the base region). Next, the emitter layer 48 is followed by optional layer 49 and finally by layers 50 and 51, the three layers constituting the emitter contact region.

Table 1 below sets forth in detail the processes used to make this principal layers of the device of FIG. 5. The term DMAAs refers to tris-dimethylaminoarsenic, and the method of using DMAAs to form a gallium arsenide layer is described in applicants' copending application entitled "Method For Selectively Growing Gallium-Containing Layers" filed concurrently herewith.

Growth Temperature = 525° C.

| Layer (Time:Thickness) | Source | Source Temp | Carrier Gas Flow Rate | Bubbler Pressure (Torr) |
|---|---|---|---|---|
| 50 Emitter Contact (441 sec:2000 Å) | TMG As $H_3$ | −9.4 — | 5 5 | 60 — |
| 49 Graded Layer (140 sec:200 Å) | TMG TMAA PhAs | −9.4 9.2 17 | 0.6 to 5 7 to 0 20 | 70 to 60 7 9.2 |
| 48 Emitter (800 sec:800 Å) | TMGA TMAA PhAs | −9.4 9.2 17 | 0.6 7.0 20 | 70 7 9.2 |
| 47 Base (220 sec:100 Å) | TMGa TMAAl DMAAs | −9.4 9.2 17 | 0.6 7.0 20 | 70 70 9.2 |
| 46 Base (26 sec:35 Å) | TMGa DMAAs | −9.4 17 | 0.6 20 | 70 9.2 |
| 45 Base (300 sec:700 Å) | TMGa TESn DMAAs | −9.4 −6.7 17 | 1.2 2.5 20 | 70 6.0 9.2 |
| 44 Collector (2000 sec:4000 Å) | TMGa DMAAs AsH$_3$ | −9.4 17 — | 4.0 20 5.0 | 70 9.2 — |
| 42 Sub-collector (882 sec:4000 Å) | TMGa AsH$_3$ | −9.4 — | 5.0 4.0 | 60 — |

It is to be understood that the above-described embodiments are illustrative of only a few of the many possible specific embodiments which can represent applications of the principles of the invention. Numerous and varied other arrangements can be devised by those skilled in the art without departing from the spirit and scope of the invention.

We claim:

1. A method for selectively growing a layer of aluminum-containing material on a masked workpiece comprising the steps of:

providing a masked workpiece including an unmasked surface portion of III–V semiconductor of the gallium arsenide family;

heating said workpiece in a reduced pressure chamber; and exposing said workpiece to a gaseous aluminum precursor and to phenylarsine so as to selectively grow said aluminum containing material on said unmasked surface portion.

2. The method of claim 1 wherein said aluminum precursor comprises trimethylamine alane.

3. The method of claim 1 wherein said workpiece is heated to a temperature in the range 500° C. to 600° C.

4. A method for growing a layer of aluminum gallium arsenide on a workpiece comprising the steps of:

providing a workpiece including a surface layer of III–V semiconductor material of the gallium arsenide family and further comprising a mask covering a portion of said surface layer while exposing selected portions;

heating said workpiece in a reduced pressure chamber to a temperature in the range 500° C. to 600° C.;

exposing said workpiece to a gaseous aluminum precursor, a gaseous gallium precursor and phenylarsine so as to selectively grow a layer of aluminum gallium arsenide on said selected portions of said surface area.

5. The method of claim 4 wherein said aluminum precursor comprises trimethylamine alane.

6. The method of claim 4 wherein said gallium precursor comprises trimethylgallium.

* * * * *